United States Patent [19]

Hughes

[11] Patent Number: 4,785,253

[45] Date of Patent: Nov. 15, 1988

[54] INTEGRATED ELECTRIC FILTER WITH ADJUSTABLE RC PARAMETERS

[75] Inventor: John B. Hughes, Hove, England

[73] Assignee: U.S. Philips Corporation, New York, N.Y.

[21] Appl. No.: 40,952

[22] Filed: Apr. 21, 1987

[30] Foreign Application Priority Data

Apr. 30, 1986 [GB] United Kingdom ............... 8610561

[51] Int. Cl.⁴ .................... H03K 5/00; H04B 1/10
[52] U.S. Cl. .................................. 328/167; 307/521
[58] Field of Search ............... 307/490, 520, 521, 525, 307/526; 328/155, 167

[56] References Cited

U.S. PATENT DOCUMENTS 4,185,246  1/1980  Schroeder ........................ 328/165
4,691,171  9/1987  Van Roermund et al. ..... 307/521 X

OTHER PUBLICATIONS

Moulding, Kenneth W., et al., "Gyrator Video Filter IC with Automatic Tuning", IEEE J. S. S. ekts., v. sc-15, n. 6, 12-80, pp. 963-967.
Banu, Mihai and Tsividis, Yannis, "On-Chip Automatic Tuning for a CMOS Continuous Time Filter", ISSCC8S, pp. 286-287.

Primary Examiner—Eugene R. Laroche
Assistant Examiner—Steven J. Mottola
Attorney, Agent, or Firm—Bernard Franzblau

[57] ABSTRACT

An integrated electrical filter includes resistors (R10-12) and capacitors (C10-12). The capacitors are controllable in value by means of a control circuit (100-109) and are formed by a binary weighted array of capacitor elements which are selectively connectable in parallel. A controlled oscillator (103) or a controlled phase shifting network (113) includes a capacitor of the same form as the filter capacitors. The oscillator (103) or phase shifter (113) form part of a phase locked loop (101, 104, 105, 107) which produces a digital code as its control signal at the output of an up/down counter (107). This digital code is latched in a register (109) to provide a control signal for the filter capacitors and also is used directly to control the capacitor(s) in the controlled oscillator or phase shifter.

21 Claims, 6 Drawing Sheets

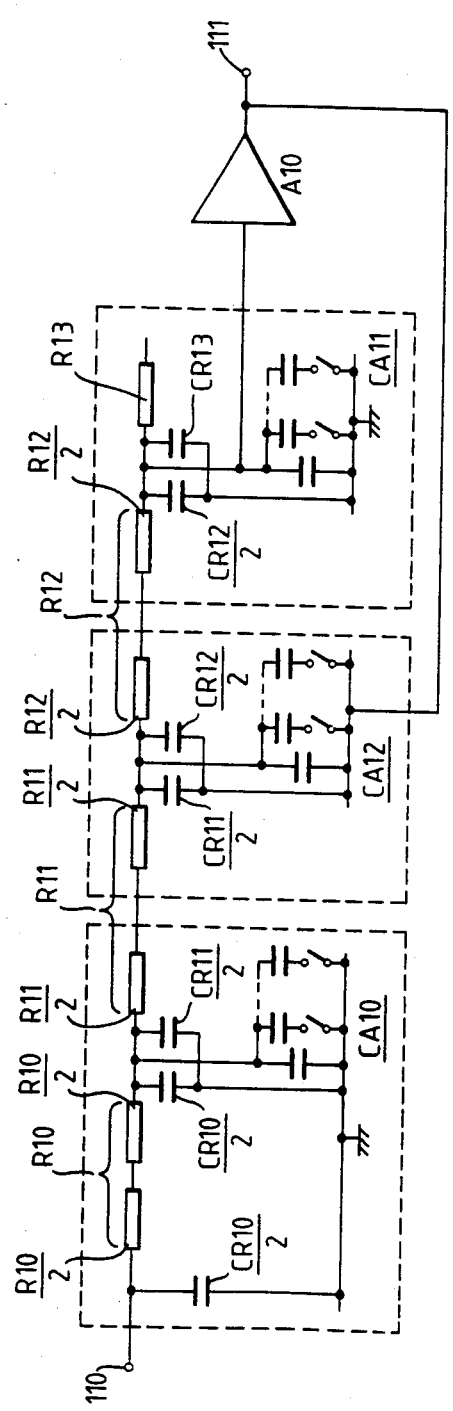

INTEGRATED ELECTRIC FILTER WITH ADJUSTABLE RC PARAMETERS

BACKGROUND OF THE INVENTION

This invention relates to an integrated electrical filter comprising at least one filter resistor, at least one filter capacitor and a control circuit for adjusting the value of the product of the resistance of the filter resistor and the capacitance of the filter capacitor. The control circuit comprises a phase detector, means for feeding a first signal to a first input of the phase detector, means for feeding a second signal to a second input of the phase detector, means for modifying the second signal in response to the output of the phase detector to cause the first and second signals to tend towards a given phase relationship, said modifying means including a control capacitor and a control resistor.

Such a filter has been disclosed in the Conference Proceedings of the International Solid State Circuit Conference 1985, at pages 286 and 287. In this circuit a phase lock loop is used in which the output of the phase detector modifies the frequency of a voltage controlled oscillator by varying the resistance of an FET by applying the voltage from the phase detector thereto. Corresponding resistors formed by FETs in the filter have the same voltage applied to them, so that their resistance is varied in the same manner as that in the voltage controlled oscillator. The disadvantage of this arrangement is that the FET resistances are non-linear with voltage changes and that it is difficult to match the characteristics of the different FETs involved.

SUMMARY OF THE INVENTION

It is an object of the invention to provide an alternative electrical filter in which the filter may be tuned by means of a control circuit to compensate for processing spreads in the values of the filter capacitors and resistors.

The invention provides an integrated electrical filter as set forth in the opening paragraph, characterised in that the control capacitor or control resistor comprises a plurality of capacitor or resistor elements, that the output of the phase detector is effective to interconnect selected ones of the capacitor or resistor elements to give the control resistor or control capacitor a selected value, and that the control circuit further comprises means for adjusting the value of the filter resistor or filter capacitor in dependence on the selected value of the control resistor or control capacitor.

In this manner real resistors and capacitors are controlled and consequently the non-linearities of FET resistors are not involved, enabling a more effective control of the circuit parameters to be effected.

BRIEF DESCRIPTION OF THE DRAWING

Embodiments of the invention will now be described, by way of example, with reference to the accompanying drawings, in which:

FIG. 7 shows a circuit diagram of the filter as implemented in the manner shown in FIG. 6, showing also the parasitic capacitors which are formed between the filter capacitors and resistors and the substrate.

DESCRIPTION OF THE PREFERRED EMBODIMENTS

Figure 1:
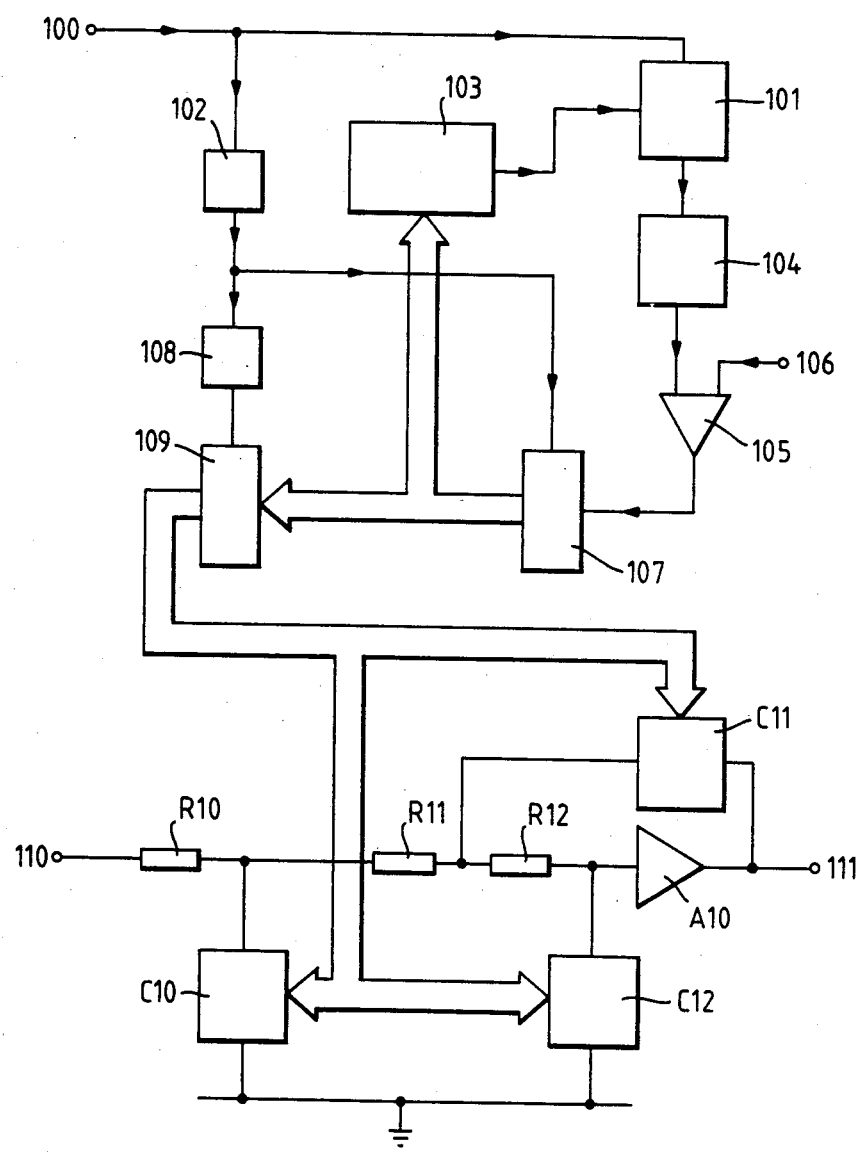
FIG. 1 is a block schematic diagram of a first embodiment of a filter according to the invention.

The filter shown in FIG. 1 has an input 100, to which an externally generated signal having a frequency equal to the cut off frequency of the filter is applied. The input 100 is connected to a first input of a phase detector 101 and to the input of a frequency divider 102. A controlled oscillator 103 has its output connected to a second input of the phase detector 101. The output of the phase detector 101 is fed via a low pass filter 104 to a first input of a comparator 105, the second input of which is connected to an input 106 to which a reference voltage is applied. The output of the comparator 105 is connected to the up/down control input of an up/down counter 107. The output of the divider 102 is connected to a divide by two circuit 108 and to the clock input of the up/down counter 107. The output of the up/down counter 107 is fed to a control input of the oscillator 103 and to a register 109. The output of the divide by two circuit 108 is fed a latching input of the register 109. The filter has an input 110 and an output 111. The input 110 is connected to one end of a resistor R10 whose other end is connected to the junction of a capacitor C10 and a resistor R11. The other end of the resistor R11 is connected to the junction of a resistor R12 and a capacitor C11. The other end of the resistor R12 is connected to the input of an operational amplifier A10 and to a capacitor C12. The other sides of the capacitors C10 and C12 are connected to ground while the other side of the capacitor C11 is connected to the output of the operational amplifier A10 and also to the filter output 111. The output of the register 109 is fed to control inputs of the capacitors C10, C11 and C12.

In operation the signal fed to input 100, which is at the frequency of the cut off frequency of the filter, is compared in phase with the output of the oscillator 103 in the phase detector 101. The input signal is also fed through the divider 102 to clock the up/down counter 107. The direction of the count will depend on whether the phase of the controlled oscillator 103 lags or leads that of the input signal applied at input 100. The magnitude of the count in the up/down counter will control the frequency of the controlled oscillator 103 and hence the phase difference between the controlled oscillator 103 and the input signal will tend towards a constant value. The counter state is latched into the register 109 under the control of the output of the divide by two circuit 108 and is used to control the value of the capacitance of capacitors C10, C11 and C12. The controlled oscillator 103 contains a capacitor array which is of the same form as that which forms capacitors C10, C11 and C12. Thus any spreads in value of the capacitor which are caused by processing factors will have the same effect on the capacitor array in the oscillator as on the capacitor arrays in the filter. Hence by modifying the values of all the capacitor arrays in dependence on the output of the up-down counter 107, the effect of processing spreads on the cut off frequency of the filter can be greatly reduced.

The reason the register only latches the up/down counter output on every other count is that, when the loop is locked, the up/down counter will oscillate by one count on every clock input since the controlled oscillator will normally vary from slightly in excess of the input frequency to slightly below the input frequency. This would cause a regular oscillation of the filter capacitance value which would cause the filtered signal to contain components formed by clock feedthrough. The divide by two facility ensures that only one peak of the oscillation is latched into the register 109 and hence a constant value is given to the capacitor arrays in the filter. The oscillator 103 is formed as an RC oscillator and includes a capacitor array of the same form as shown for the filters. Thus by controlling the value of the capacitor aray from the output of the up/down counter 107 to cause the oscillator to produce an output frequency which is on average equal to that of the input signal at input 100, the oscillator and hence the filter is tuned to the input frequency regardless of processing spreads, provided they remain within the adjustment range.

Figure 2:
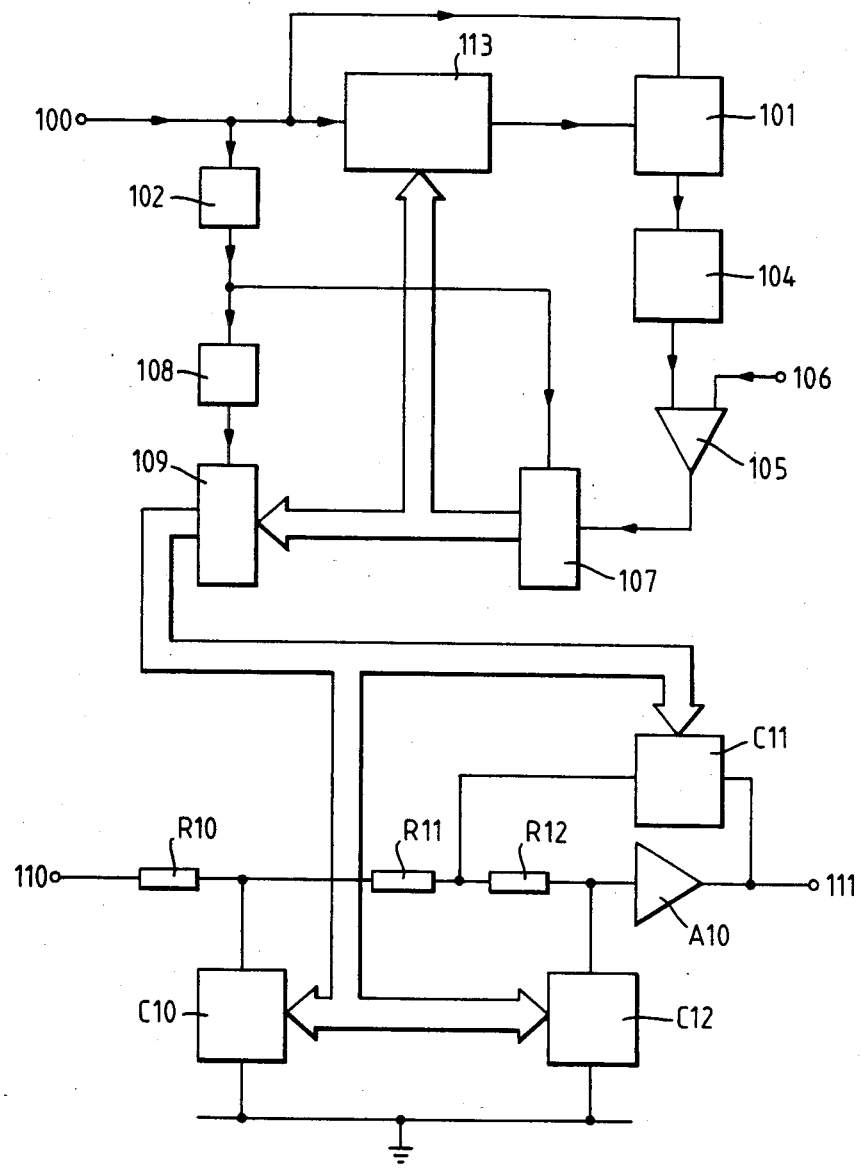
FIG. 2 is a block schematic diagram of a second embodiment of a filter according to the invention.

FIG. 2 shows a second embodiment of a filter according to the invention. The differences between the embodiments of FIGS. 1 and 2 lie solely in the control circuit and only those areas where the two embodiments differ will be discussed in detail. In FIG. 2 corresponding elements have been given the same reference signs as in FIG. 1. The input 100 is connected to a first input of the phase detector 101 and also to the input of a phase shifting circuit 113. The output of the phase shifting circuit 113 is connected to the second input of the phase detector 101. The phase shifting network 103 is controlled by means of the output count from the up-down counter 107 in the same manner as the controlled oscillator 103 in the FIG. 1 embodiment was controlled. Thus the only difference between the FIG. 1 and FIG. 2 embodiments is that instead of providing a controlled oscillator for the second input to the phase detector 101, the input signal is delayed by the phase shifting circuit 113 before being applied to the second input and compared there with the input signal applied directly to the phase detector.

Figure 3:
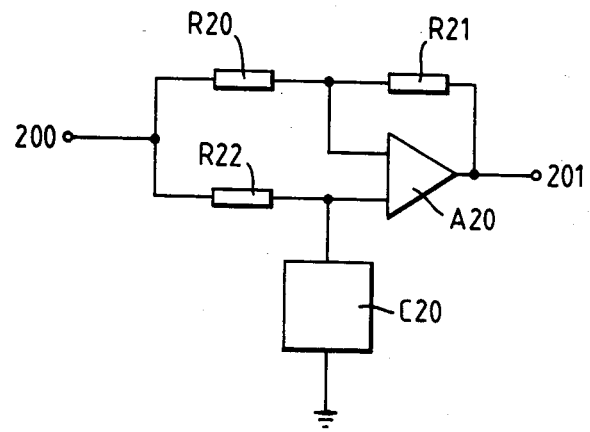
FIG. 3 is a circuit diagram of a 90' phase shifter for use in the embodiment of FIG. 2.

FIG. 3 shows an embodiment of a phase shifting network suitable for inclusion as the phase shifter 113. The network shown in FIG. 3 has an input 200 to which the input 100 is connected. The input 200 is connected to the junction of two resistors R20 and R22, the other end of resistor R20 being connected to a first input of a differential amplifier A20 and to a resistor R21, the other end of which is connected to the output of the amplifier A20. The other end of the resistor R22 is connected to the junction of a capacitor C20 and a second input of the differential amplifier A20. The other end of the capacitor C20 is connected to ground and the output of the network 201 is connected to the output of the amplifier A20. The value of the capacitor C20 is adjusted by means of the output from the up-down counter 107 to produce a 90' phase shift through the network 113. Thus the signal at the output 201 is 90' out of phase with the signal at the input 200 when the capacitor array C20 is correctly adjusted.

Figure 4:
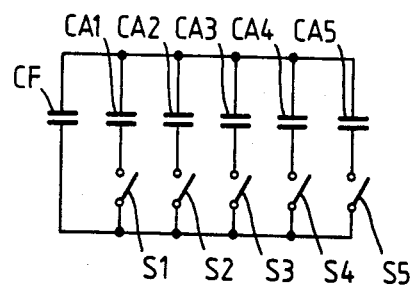
FIG. 4 shows a capacitor array for use in the filters of FIGS. 1 and 2, and in the phase shifter of FIG. 3.

FIG. 4 shows the capacitor array which may be used as the capacitor C10, C11 and C12, or C20 in the phase shifting circuit. The capacitor array comprises a first capacitor CF and five further capacitors C1 to C5, which are selectively connectable in parallel with the fixed capacitor CF by means of switches S1 to S5. These switches are controlled by the output of the up-down counter 107. The capacitors C1 to C5 follow a binary progression in value, thus is C5 equal to twice C4 is equal to twice C3 is equal to twice C2 is equal to twice C1. The values of the capacitors CF and C1 to C5 are chosen such that with the nominal values half of the capacitance value of the capacitors C1 to C5 is switched in parallel with CF thus allowing for the same capacitance change above and below the nominal value to compensate for process spreads in either direction.

Figure 5:
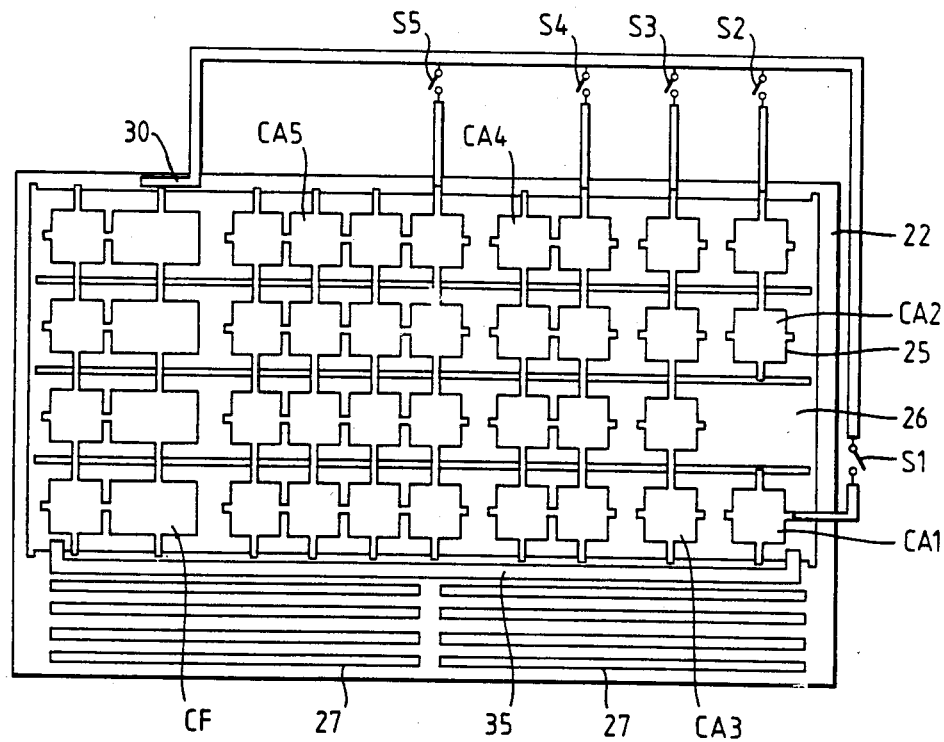
FIG. 5 shows a resistor/capacitor array for use in the filters of FIGS. 1 and 2.

FIG. 5 shows a possible layout for the capacitor array in the filters and control circuit. The capacitor array is formed above a conductive layer 22 which may be in the form of an n-well. The capacitor is formed from two plates which comprise polysilicon layers. The first layer 26 is separated from the conductive layer 22 by a dielectric layer and the second layer 25 is separated from the first layer 26 by a further dielectric layer. A number of resistor strips 27 are formed in the same conductive layer as the upper plate of the capacitors. The capacitors CA1 to CA5 are formed from elemental capacitors, that is CA1 comprises one element whereas CA5 comprises sixteen elements interconnected. The fixed capacitor CF is constructed also to include the parasitic capacitances between the resistor strips 27 and the layer 22 and between the bottom plate 26 and the layer 22. This is achieved by connecting the top plate of the capacitor CF to the conductive layer 22 via the metalisation 30. The resistor strips 25 are selectively metalised to obtain the correct resistance value and are connected to the metalisation 35 which causes the resistor strips to be connected to the bottom plate of the capacitor array. The arrangement shown in FIG. 5 may be used as a standard module to construct a filter of the form shown in FIGS. 1 and 2.

Figure 6:
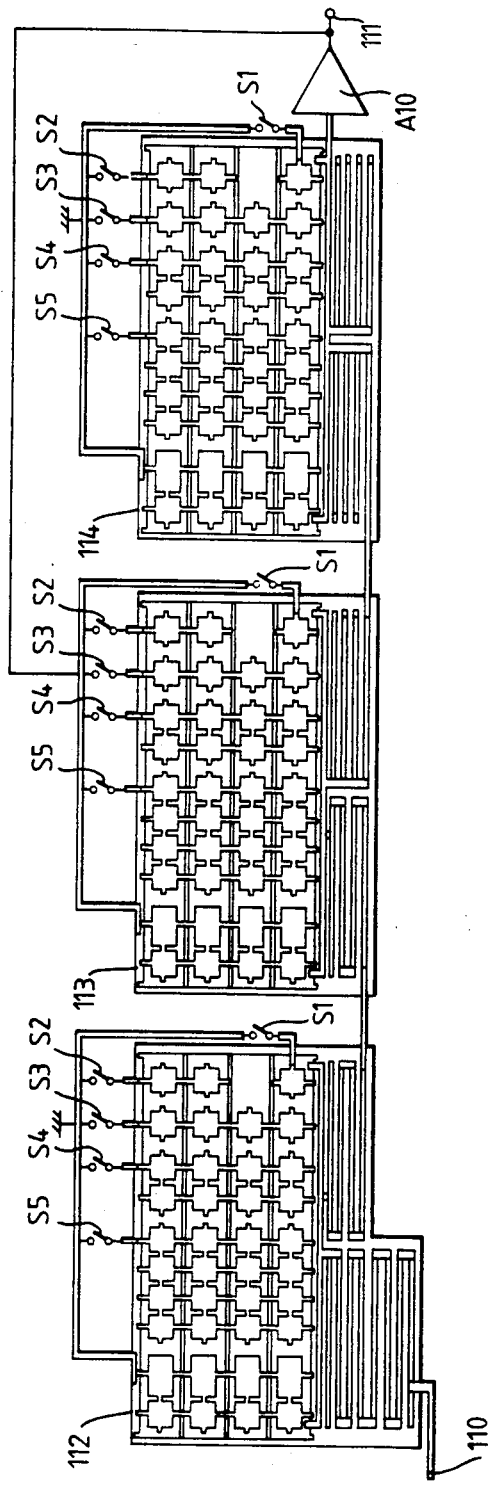
FIG. 6 shows an implementation of the filter shown in FIGS. 1 and 2.

FIG. 6 shows how three of these modules may be interconnected to form the filter of FIG. 1. FIG. 6 omits the control circuitry. As shown in FIG. 6 the input 110 is connected to one of the resistor strips which is interconnected with other resistor strips on the left hand side of the module 112 and which together form resistor R10 and is connected to the bottom plate of the capacitor array. The capacitor array forms the capacitor C10 and its value may be adjusted by means of switches S1 to S5. The resistor strips on the right hand side of the first module 112 form half of the resistor R11 while the resistor strips on the left hand side of the module 113 form the other half of the resistor R11. The capacitor array of the module 113 forms the capacitor C11 while the resistor strips on the right hand of the module 113 form half the resistor R12. The resistor strips on the left hand wide of module 114 form the other half of resistor R12 while the capacitor array forms the capacitor C12. The output from the module 104 to the input of the amplifier A10 is taken from the connection between the left hand resistor strips and the capacitor array bottom plate. The right hand resistor strips are connected in circuit so that the stray capacitance between the resistor strips and the underlying layer 22 remain constant, but their right hand ends are left open circuit so that they have no resistive effect within the circuit.

FIG. 7 shows a circuit diagram of the filter of FIG. 1 showing parasitic capacitance between the resistor and the underlying layer 22. The resistors are split into two parts and allocated to adjacent modules so that a better approximation to a lumped capacitor is obtained. Strictly, of course, the parasitic capacitance of the resistors is distributed rather than lumped. These parasitic capacitances are connected in parallel with the fixed capacitor CF and the value chosen for the fixed capacitor CF can take into account the calculated values for the parasitic capacitances associated with the resistor and the capacitor array.

Although this description has provided control by means of switchable capacitor arrays, there is no intrinsic reason why switchable resistor arrays should not be used instead. However, if switchable series sections of resistors are employed it must be ensured that the resistance of the switches is sufficiently low so that they have no appreciable effect on the total series resistance.

FIG. 5 shows a particular embodiment of capacitor and resistor array but many other arrangements are possible. It is advantageous if the array in the control circuit is either the same as that in the filter, in which case it need not be split up into sections as shown in FIG. 5, or that the array in the control circuit or in the filter comprises a plurality of the arrays, i.e. the values of the capacitor and resistor in the control circuit may be m times the values of the capacitor and resistor in the filter, or vice versa. In this case the frequency of the signal applied to the phase detector would be m times greater or smaller than the cut off frequency of the filter. Thus if the ratio of parasitic capacitance to the fixed capacitance in the array of the control circuit is the same as the ratio of the parasitic capacitance to the fixed capacitance in the array of the filter circuit, then both the control circuit and filter will track together with processing spreads.

From reading the present disclosure, other modifications will be apparent to persons skilled in the art. Such modifications may involve other features which are already known in the design and use of integrated electrical filters and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation or modification of one or more of those features which would be obvious to persons skilled in the art, whether or not it relates to the same invention as presently claimed in any claim and whether or not it mitigates any or all of the same technical problems as does the present invention.

I claim:

1. An integrated electrical filter comprising at least one filter resistor, at least one filter capacitor and a control circuit for adjusting the value of the product of the resistance of the filter resistor and the capacitance of the filter capacitor, the control circuit comprising a phase detector, means for feeding a first signal to a first input of the phase detector, means for feeding a second signal to a second input of the phase detector, means for modifying the second signal in response to an output of the phase detector to cause the first and second signals to tend towards a given phase relationship, said modifying means including a control capacitor and a control resistor, characterised in that the control capacitor or control resistor comprise a plurality of capacitor or resistor elements, respectively that the output of the phase detector is effective to interconnect selected ones of the capacitor or resistor elements to give the control capacitor or control resistor a selected value, and that the control circuit further comprises means for adjusting the value of the filter resistor or filter capacitor, respectively in dependence on the selected value of the control resistor or control capacitor.

2. A filter as claimed in claim 1, characterised in that the filter resistor or capacitor comprise a plurality of resistor or capacitor elements, selected ones of which give the filter resistor(s) or capacitor a selected value.

3. A filter as claimed in claim 2, characterised in that the first signal comprises an externally generated signal and the second signal is generated by a controllable oscillator having a frequency determining network which comprises the control resistor and control capacitor.

4. A filter as claimed in claim 1, characterised in that the first signal comprises an externally generated signal said first signal being also fed to a phase shifting network at whose output the second signal is produced, wherein the phase shifting network includes the control resistor and control capacitor.

5. A filter as claimed in claim 1, characterised in that the modifying means comprises an up-down counter which is clocked by said first signal or a sub-multiple thereof and whose count direction is controlled by the output of the phase detector, the counter output being effective to select the capacitor or resistor elements.

6. A filter as claimed in claim 5, characterised in that the counter output is stored in a register having an output which is effective to select the filter capacitor or resistor elements.

7. A filter as claimed in claim 6, characterised in that the output of the up/down counter is read into the register on alternate counter clock cycles only.

8. A filter as claimed in claim 1, characterised in that the filter resistor(s) and capacitor(s) are constructed in the same form as the control resistor and capacitor.

9. A filter as claimed in claim 8, characterised in that the control and filter capacitors each comprise a fixed capacitor and a binary weighted plurality of associated capacitors each of which is selectively switchable in parallel with its respective fixed capacitor.

10. A filter as claimed in claim 9, characterised in that the control resistor and capacitor are formed above an underlying continuous conductive layer and that a parasitic capacitance between the control capacitor and the conductive layer is connected in parallel with the fixed capacitor.

11. A filter as claimed in claim 10, characterised in that the parasitic capacitance between the control resistor and the conductive layer is connected in parallel with the fixed capacitor.

12. A filter as claimed in claim 9, characterised in that the filter is split into one or more resistor-capacitor combinations wherein each resistor-capacitor combination is formed above a separate continuous conductive layer, a parasitic capacitance between the capacitor and the conductive layer being connected in parallel with the fixed capacitor, and each conductive layer is connected either to ground or an output of an operational amplifier.

13. A filter as claimed in claim 12, characterised in that the parasitic capacitance between the resistor and the conductive layer is connected in parallel with the fixed capacitor.

14. A filter as claimed in claim 10, characterised in that the capacitor is formed by first and second conductive layers separated by a dielectric and the resistor comprises a further separate area of the second layer, the first layer being separated from the underlying conductive layer by a further dielectric layer, wherein that part of the second layer forming a plate of the fixed capacitor is connected to the conductive layer, those parts of the second layer forming plates of the associated capacitors are connected to the underlying conductive layer by selectively operable associated switches and that part of the second layer forming the resistor is connected to the first layer.

15. A filter as claimed in claim 10 characterised in that it comprises a resistor capacitor ladder network having series resistors and parallel capacitors wherein the resistor-capacitor combinations are such that half of two successive series resistors are formed with the capacitor to which their junction is connected.

16. A filter as claimed 1 wherein the first signal comprises an externally generated signal and the second signal is generated by a controllable oscillator having a frequency determining network which comprises the control resistor and control capacitor.

17. A filter as claimed in claim 2 wherein the first signal comprises an externally generated signal that is also fed to a phase shifting network at whose output the second signal is produced, and the phase shifting network includes the control resistor and control capacitor.

18. A filter as claimed in claim 2 wherein the modifying means comprises an up/down counter clocked by a signal rotated to said first signal and whose count direction is controlled by the output of the phase detector, the counter output being effective to select the capacitor or resistor elements.

19. A filter as claimed in claim 2 wherein the filter resistor and filter capacitor are of the same form as the control resistor and control capacitor, said control capacitor and said filter capacitor each comprising a fixed capacitor and a binary weighted plurality of associated capacitors each of which is selectively switchable in parallel with its respective fixed capacitor.

20. An integrated electric filter comprising at least one filter resistor device, at least one filter capacitor device and a control circuit for adjusting the value of the product of the resistance of the filter resistor device and the capacitance of the filter capacitor device, the control circuit comprising a phase detector, means for feeding a first signal to a first input of the phase detector, means for feeding a second signal to a second input of the phase detector, means for modifying the second signal in response to an output of the phase detector to cause the first and second signals to tend towards a given phase relationship, said modifying means including a control capacitor arrangement and a control resistor arrangement, at least one of said arrangements comprising a plurality of elements selectively interconnected in response to an output signal of the phase detector to give said one arrangement a desired value, and wherein the control circuit further comprises means for adjusting the value of the product of the resistance of the filter resistor device and the capacitance of the filter capacitor device in dependence on the value of said one arrangement.

21. A filter as claimed in claim 20 wherein at least one of said devices comprises a plurality of elements, selected ones of which give the device a selected value.

* * * * *